(12) United States Patent
Baragatti et al.

(10) Patent No.: US 7,176,679 B2
(45) Date of Patent: Feb. 13, 2007

(54) SENSOR STRUCTURE AND MAGNETIC FIELD SENSOR

(75) Inventors: Claire Baragatti, Grenoble (FR); Robert Cuchet, Grenoble (FR); Line Vieux-Rochaz, Sassenage (FR)

(73) Assignee: Commissariat A l'Energie Atomique, Paris (FR)

( * ) Notice: Subject to any disclaimer, the term of this patent is extended or adjusted under 35 U.S.C. 154(b) by 0 days.

(21) Appl. No.: 10/491,994

(22) PCT Filed: Oct. 7, 2002

(86) PCT No.: PCT/FR02/03407

§ 371 (c)(1),
(2), (4) Date: Apr. 7, 2004

(87) PCT Pub. No.: WO03/032001
PCT Pub. Date: Apr. 17, 2003

(65) Prior Publication Data
US 2004/0263163 A1 Dec. 30, 2004

(30) Foreign Application Priority Data
Oct. 9, 2001 (FR) ................... 01 12956

(51) Int. Cl.
*G01R 33/02* (2006.01)
*H01L 43/00* (2006.01)
(52) U.S. Cl. .................. 324/252; 338/32 R
(58) Field of Classification Search ............... 324/252, 324/207.21; 338/32 R, 32 H
See application file for complete search history.

(56) References Cited
U.S. PATENT DOCUMENTS
6,066,947 A 5/2000 Tamura ................. 324/207.21
6,075,361 A 6/2000 Coehoorn et al. .......... 324/252

FOREIGN PATENT DOCUMENTS
FR 2775772 A1 9/1999
JP 02017476 A * 1/1990

OTHER PUBLICATIONS
Wanjun Ku, et al., "Precision X-Y Robotic Object Handling Using a Dual GMR Bridge Sensor", IEEE Transactions on Magnetics, vol. 36, No. 5, Sep. 2000, pp. 2782-2784.
Rapport De Recherche Internationale dated Jan. 22, 2003, PCT/FR/02/03407.

* cited by examiner

*Primary Examiner*—Edward Lefkowitz
*Assistant Examiner*—David M. Schindler
(74) *Attorney, Agent, or Firm*—Thelen Reid Brown Raysman & Steiner LLP

(57) ABSTRACT

A method and an apparatus of a magnetic field sensor structure are disclosed. The magnetic field sensor structure is formed by a bridge of four magnetoresistors (1–4), wherein each magnetoresistor has a longitudinal direction, and each magnetoresistor (1–4) is polarised by magnets (15–19). Also, each magnet has a main magnetisation field along an axial magnetisation direction, and a magnetic leakage field. The polarisation magnets (15–19) and the magnetoresistors (1–4) are arranged in the form of layers on the same substrate. In one embodiment, the polarisation magnets (15–19) are at the same level as the magnetoresistors (1–4) wherein the polarisation magnets (15–19) have the same main magnetisation direction, which is contained in the plane of the layers. The magnetoresistors have their longitudinal direction parallel with that of the axial direction of the magnets. In one embodiment, two magnetoresistors are arranged in the axial field of magnets and two others are in the magnet leakage field.

17 Claims, 7 Drawing Sheets

SENSOR STRUCTURE AND MAGNETIC FIELD SENSOR

FIELD OF THE INVENTION

The invention relates to the field of structures for sensors and sensors incorporating such structures, intended to measure magnetic fields created for example by electric currents, magnets, any material or magnetic object or the terrestrial magnetic field or any other magnetic field.

STATE OF THE RELATED ART

The article referenced [1] in an appendix to the present disclosure discloses a method to polarise 4 giant magnetoresistors (GMR) of a Wheatstone bridge in a paired opposing fashion using integrated magnet leakage fields. According to the prior art, not described in this article, the Wheatstone bridge comprises 4 GMRs connected in series in a loop. This gives four connection points between two consecutive GMRs of the series. Two pairs of non-consecutive connection points define two diagonals of the bridge, a first and a second. A voltage is applied along the first diagonal. When the bridge is in equilibrium, a voltage measured along the second diagonal is zero. When the bridge is in disequilibrium, for example because the values of the GMRs of the bridge have changed under the effect of the variation of the value of a magnetic field, a voltage appears in the second diagonal wherein the value of the voltage is representative of the value of the magnetic field. It should be noted that it is also possible to use a voltage dividing bridge, consisting of two GMRs connected in series. The two GMRs have two ends. The first ends of each GMR are connected together at one connection point. The second ends of each GMR are connected to a reference voltage source. The variations in the voltage value at the terminals of either of the GMRs are representative of the variations of the magnetic field in which the two GMRs are located. For the polarisation of the GMRs, as described in the article, two magnets are used, one for each arm of the bridge. In FIG. 2b of this article representing a cross-section of the bridge sensor, it can be seen how the leakage fields polarise, firstly, one of the GMRs in one direction and, secondly, the other GMR in the opposite direction.

The four GMRs, two for the X direction and two for the Y direction are produced in the same plane. It is specified in the first column of page 2783 of this article that, for each arm of the bridge, one of the GMRs is located under the CoPt film forming the permanent magnet 0.1 μm underneath. The other GMR is located 1 μm from the side of the CoPt film. It is also specified that, under these conditions, the two magnetoresistors forming one arm of the bridge are subject to opposite leakage fields of a roughly equal amplitude. The field response of the "full chip" magnetoresistor material, i.e. deposited on the entire surface of a silicon chip, of GMRs is given in FIG. 3 of the article. The fact that it is the response of the material and not the response of a GMR under the form of a bar of material is emphasised. It is pointed out that the response, i.e. the magnetoresistor value as a function of the magnetic field, is linear until the saturation magnetic field. It will be seen below that this response may be different in the case of etched patterns in the form of bars. In the disclosure of the article, it is specified that each magnetoresistor comes in the form of a 154 μm long and 3 μm wide bar. The material has a high saturation field, of the order of 600 Oersteds making it possible to measure fields of up to 150 Oersteds with the polarisation selected in this article. The magnet is 0.2 μm thick. It is deposited by cathodic evaporation (bottom of first column of page 2783 of this article). It is known that, using this method, it is not possible to deposit thicknesses of more than 1 μm due to stress occurring in the material. The magnetisation is oriented parallel to the layer plan.

The magnetoresistor sensor configuration described in this article involves several drawbacks.

The first drawback is that the giant magnetoresistors work in the transverse direction (top of first column of page 2783 of this article), i.e. the magnetic polarisation fields and the magnetic field to be measured are oriented perpendicular to the width of the GMR bars. Those skilled in the art know that, under these conditions, for widths such as those used in the device described in the article, the field response of the bar is not linear in the range of magnetic fields between 0 and a value which depends on the magnetoresistor material and its width, due to a shape effect. There is a plateau effect of the curve representing the resistance value of the giant magnetoresistor which increases as the bar width decreases. In this way, the applicant made measurements which demonstrate that, for a 64 μm long and 1 or 2 μm wide bar, the value of the giant magnetoresistor practically does not change when the field is between 0 and up to 200 Oersteds. The plateau value for the same magnetoresistor length is approximately 170 Oersteds for a 4 μm width, approximately 80 Oersteds for a 8 μm width and approximately 40 Oersteds for a 16 μm width. In this way, the use of a sensor such as that described in the article is excluded for the measurement of weak fields, since, for low values, no significant changes of the value of the giant magnetoresistor is observed.

BRIEF DESCRIPTION OF THE INVENTION

A second drawback of the prior art described above stems from the fact that, in the configuration described in the article, the positioning of the GMRs with respect to the edges of the magnets is very critical and influences the performances of the device directly. Simulations performed by the applicant demonstrate that, with the configuration described in the article, a thin magnet (0.2 μm) and GMRs positioned 1 μm from the edge of the magnets, there is a high gradient of the magnetic polarisation field from one edge of the GMR to the other. This gives a polarisation field of 270 Oersteds on a first edge and only 65 Oersteds on the other edge at a distance of 3 μm from the first edge. The mean polarisation is 170 Oersteds, similar to that given in the article (150 Oersteds).

This rapid decline of the field over a few microns means that a difference in positioning for example of 1 μm towards the outside, of the resistor GMR1 with respect to the edge of the magnet, will change, according to the simulation, the mean polarisation value from 170 to 95 Oersteds. This decrease is a major drawback in GMR operation, since it reduces the field operating range with respect to the range that it was thought could be measured. In addition, it turns out that 1 μm is precisely the order of magnitude of the positioning error obtained with standard photolithography machines used in microelectronics. It should also be noted that the same positioning error degrades the plate to plate reproducibility of plates from the same batch.

With reference to the state of the related art described above, the invention proposes a sensor with a structure which makes it possible to measure weak fields, for example below 50 Oersteds, which offers improved reproducibility in terms of sensor performances.

The structure of the sensor according to the invention comprises, as in the prior art described in the abovementioned article, a bridge of GMRs polarised by integrated magnets. However, according to the invention, the GMRs, which are 2 in number to form a dividing bridge or 4 to form a Wheatstone bridge, do not work in the transverse direction but in the direction of greater sensitivity which is generally the longitudinal direction. In the configuration according to the invention, the magnetic polarisation fields and the magnetic field to be measured are oriented parallel with the length of the bars. In this configuration, the plateau effect is no longer present. The response curve giving the magnetoresistor value as a function of the magnetic field applied is perfectly linear from the value 0, to the value of the saturation field of the material forming the giant magnetoresistor. Therefore, the proposed structure is perfectly suitable for the measurement of ranges of values incorporating weak fields, particularly fields below 50 Oersteds.

In this way, the invention relates to a magnetic field sensor structure formed by magnets and by a magnetoresistor bridge, deposited in the form of layers on the same substrate, the magnetoresistors each having a longitudinal direction, the bridge comprising two magnetoresistors or a pair of magnetoresistors, a first and a second magnetoresistor or a first and a second pair of magnetoresistors, each magnetoresistor being polarised by one or more magnets each having two main magnetisation field zones, one incoming field zone and one outgoing field zone, aligned along an axial magnetisation direction, and two magnetic leakage field zones wherein the direction of the magnetic field is parallel and in the opposite direction to the field in the main field zones, the first of the two magnetoresistors of the bridge or each of the magnetoresistors of the first pair of magnetoresistors of the bridge being arranged in a main magnet field zone and the other magnetoresistor or each of the magnetoresistors of the second pair of magnetoresistors of the bridge being arranged in a magnet leakage field zone such that the two magnetoresistors or the magnetoresistors of each pair are polarised by magnetic fields of opposite directions, characterised in that the polarisation magnet(s) are at the same level as the magnetoresistors, in that all the polarisation magnets have the same main magnetisation direction contained in the plane of the layers and in that the magnetoresistors of the bridge have their longitudinal direction parallel with the axial magnetisation direction of the magnets.

When it is said that the magnetoresistors are at the same level, this does not exclude a slight difference in level due for example to the presence of an insulation layer present under a magnetoresistor and absent under the magnet, or conversely. This excludes a magnetoresistor being positioned under a magnet as in the prior art described above.

BRIEF DESCRIPTION OF FIGURES

Examples of embodiments of the invention, results and comparisons with the prior art will be explained and discussed below with reference to the appended figures wherein FIG. 1 schematically represents a magnetoresistor bridge.

DETAILED DESCRIPTION OF EXAMPLES OF EMBODIMENTS

In the figures, the components having the same function are represented by identical reference numbers. The term rectangular which will be used frequently to characterise the shape of the magnets or magnetoresistors must be taken in the most general sense of the term which includes square shapes.

Figure 1:
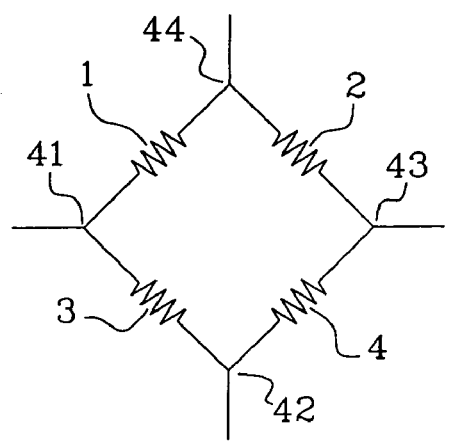

The operation of a dividing bridge and the operation of a Wheatstone bridge should first of all be pointed out with reference to FIG. 1.

A dividing bridge is formed as described above by two magnetoresistors for example magnetoresistors 1 and 3 connected in series between a point 44 and a point 42. A reference voltage is applied between the points 42, 44. The magnetoresistors 1 and 3 are polarised by magnetic fields of opposite directions. An output voltage measured at the terminals of either of the two magnetoresistors 1, 3 is representative of the variation of the value of the magnetoresistors. This magnetoresistor value is itself a function of the value of the magnetic field wherein the structure formed by the two magnetoresistors 1 and 3 is positioned. The output voltage is thus representative of the value of said magnetic field.

The Wheatstone bridge is formed by a looped series of four resistors. In the case envisaged here, each resistor is a giant magnetoresistor 1, 2, 3 and 4. When the bridge is not polarised, the magnetoresistors are equal to each other. The magnetoresistors 1 and 3 form a first arm of the bridge together. The magnetoresistors 2 and 4 form a second arm of the bridge together.

For the Wheatstone bridge to operate, at least one of the magnetoresistors must be polarised. The most efficient operation of a bridge is obtained when the four magnetoresistors of the bridge are polarised in pairs in an equal and opposite manner. In this way, the magnetoresistors 1 and 4 are polarised in a first direction by the same value and the magnetoresistors 2 and 3 are polarised by the same value but in the opposite direction.

Figure 2:
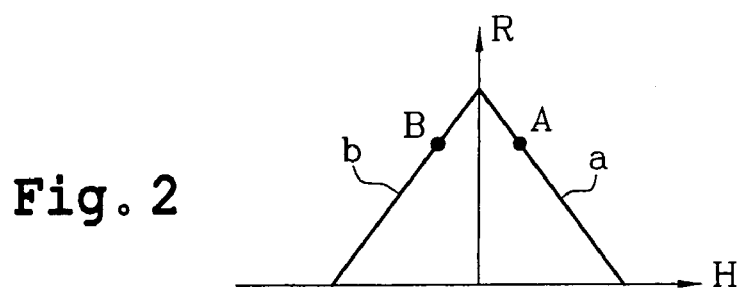
FIG. 2 is a curve which represents the variation in the value of a giant magnetoresistors as a function of the value of magnetic fields wherein it is positioned.

FIG. 2 represents the curves a and b giving on the Y-axis the value of a magnetoresistor as a function of the magnetic field applied. Curve a represents the value of the magnetoresistors 1 and 4, to which a positive field is applied. Curve b represents the value of the magnetoresistors 2 and 3 to which a negative field is applied. In this way, it can be seen that applying a polarisation of the same amplitude but of an opposite sign to the resistors 1, 4 and 2, 3, respectively, shifts the operating point corresponding to a null field, to a point of curves a and b, for example as represented in FIG. 2, to points A and B.

Each of the magnetoresistors must be polarised such that the Wheatstone bridge remains in equilibrium in the idle state, i.e. when the field to be detected is null.

Figure 3:
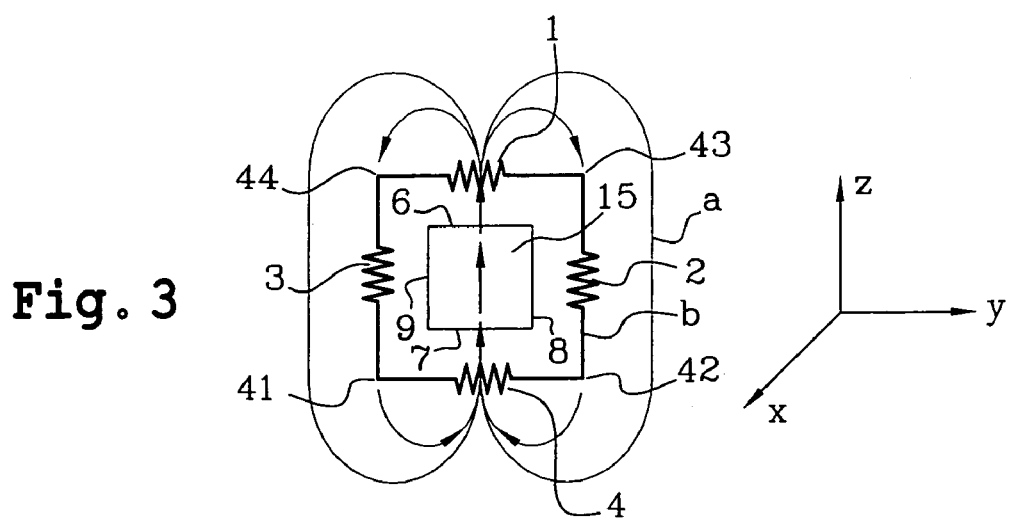
FIG. 3 schematically represents a first example of an embodiment of the invention wherein the giant magnetoresistors forming a bridge are arranged on the same plane as a central magnet and around said magnet.

According to a first embodiment of the invention represented in FIG. 3, a central polarisation magnet 15 is positioned inside a plane quadrilateral formed by the four magnetoresistors 1–4 of a Wheatstone bridge. When the structure forms a dividing bridge, the structure only comprises two magnetoresistors, for example magnetoresistors 1 and 3. In the present disclosure, we will essentially discuss the case of the Wheatstone bridge. However, any of the subsequent statements on magnetoresistors 1 and 3 are applicable to the case wherein the bridge is a dividing bridge only comprising the two magnetoresistors 1 and 3.

The magnets and the magnetoresistors are at the same level. The term at the same level indicates that the distances of the depositions forming the magnetoresistors and the depositions forming the magnet, from a common substrate are roughly equal. It will be seen below with reference to FIG. 6 that the GMRs and the magnet have a difference in level which only differs by the thickness of an electrically insulating layer.

The polarisation value is selected as a function of the value of the field to be detected. Different polarisation values are obtained for example with different magnet sizes. In the example represented in FIG. 3, the magnet 15 has, along a cross-section via a plane parallel with the plane of the layers, a rectangular and more specifically square shape. This shape is in no way mandatory. For example, the magnet could have any shape, for example oval or rectangular with bevelled or rounded edges. The magnetoresistors 1 and 4, forming a first pair of magnetoresistors are positioned at either end of the magnet 15, the magnetoresistor 1 is in the outgoing main field zone and the magnetoresistor 4 is in the incoming main field zone. In the example represented here, where the magnet 15 is rectangular, these zones are opposite faces 6, and 7 of the magnet 15, respectively. The main magnetic field created by the magnet 15 is oriented along an axial line of this magnet not shown, from the face 7 to the face 6 perpendicular to said faces. The magnetoresistors 2 and 3, forming a second pair of magnetoresistors, positioned in the leakage field zones of the magnet 15, respectively, are in this configuration along the faces 8, 9 perpendicular to the faces 6, 7. The faces 6 and 7 wherein the main flux of the field created by the magnet 15 passes will be referred to as the main flux face and faces 8 and 9 parallel with the leakage field will be referred to as the leakage face. In FIG. 3, the field lines and the fields have been represented by lines a, b and by arrows. The leakage field is necessarily weaker than the main field of the magnet 15. Therefore, for the magnetoresistor 2 or 3, a distance from the edge of the magnet and magnetoresistor length making it possible to obtain the selected polarisation and the best homogeneity of the field in the magnetoresistor is sought. The field is homogeneous in a zone if the value of the field is roughly constant at each point of the zone. Then for magnetoresistor 1 or 4, the distance from the face of the magnet for which said magnetoresistor is polarised by a field of the same amplitude as that of the magnetoresistors 2 or 3 is sought. In view of the above explanation on the force of the main and leakage fields, the magnetoresistors 1 and 4 are more distant in this configuration from the edge of the magnet than the magnetoresistors 2 and 3. It is stressed at this stage that, in FIG. 3, the magnet 15 is represented physically along a cross-section parallel with the plane of the layers. However, the magnetoresistors 1 and 4 are represented simply to show their electrical connections. However, it is necessary to understand that, in view of the selected arrangement, the field vector passing through each of the four magnetoresistors is parallel with a longitudinal axis of the magnetoresistors 1–4 in turn parallel with the axial direction of the field of the central magnet 15. In other words, as a result, the magnetoresistors 1–4 work in their longitudinal direction and no longer in the transversal direction as in the prior art. In order to identify the different directions, in FIG. 3, an orthonormed trihedron is represented wherein the direction Oz is the direction of the main magnetic field of the magnet 15, the direction Oy is the direction of the axis perpendicular to Oz in the layer plane of the magnet 15. This orientation will be retained in the embodiments presented below.

For correct operation of the structure, it is better for the geometry of the magnetoresistors to be such that each magnetoresistor is positioned entirely in a zone where the field is homogeneous. For the main field zones, located on either side of the magnet 15, this condition is met better when the geometric centre of the magnetoresistor is centred on a central axis of the face of the magnet close to the magnetoresistor. In the example discussed here, the magnets have rectangular shapes, the main flux faces 6, 7 being perpendicular to the leakage faces 8, 9, the geometric centres of two magnetoresistors 1, 4 of the bridge polarised by main fields are roughly on a central axis of the main flux faces 6, 7, the geometric centres of the two other magnetoresistors 2, 3 of the bridge polarised by leakage fields are roughly on a central axis of the leakage faces 8, 9.

To meet the magnetoresistor polarisation condition along a longitudinal direction, the magnetoresistors are produced whenever necessary to remain in a homogeneous field zone, in the form of a series of magnetoresistors each consisting of one or more fingers referenced 12 for the magnetoresistors 1, 4 polarised by main magnet fields and 12' for the magnetoresistors 2, 3 polarised by magnet leakage fields. These fingers are preferentially electrically connected to each other by the same material as that forming the fingers and positioned between two consecutive finger ends to form a coil. The longitudinal dimension of the joins between fingers is perpendicular to the local direction of the magnetic field of the magnets. The fingers may also be connected to each other by a conductive component. The connection between the fingers is as for the other conductive connections referenced 5. With this magnetoresistor embodiment in the form of a series of fingers, it becomes possible to modulate the position, shape and number of fingers forming each magnetoresistor so that each finger is oriented longitudinally parallel with the polarisation field and the set of fingers forming a magnetoresistor is positioned in a homogeneous zone in terms of magnetic polarisation field value. In view of the symmetries of the fields around a magnet, two or 4 magnetoresistors will generally be produced in the form of a series of fingers. In this way, although the surface area represented by the fingers connected in series forming a magnetoresistor together may have a shape with a longitudinal direction perpendicular to the direction of the main field, the magnetoresistor is said to be longitudinally oriented parallel with the polarisation filed since each finger is oriented in this way. Naturally, this modulation of the position, shape, and number of fingers forming each magnetoresistor must not affect the equality of the magnetoresistors forming the Wheatstone bridge with respect to each other. In this way, the bridge remains in equilibrium. Examples of magnetoresistors consisting of one or more fingers arranged so as to be in a homogeneous field zone will be given below.

In order to enlarge the homogeneous field zone, it is planned according to alternative embodiments of the invention to enclose the magnetoresistors polarised by the axial field or the magnetoresistors polarised by the leakage field with magnets.

Figure 4:
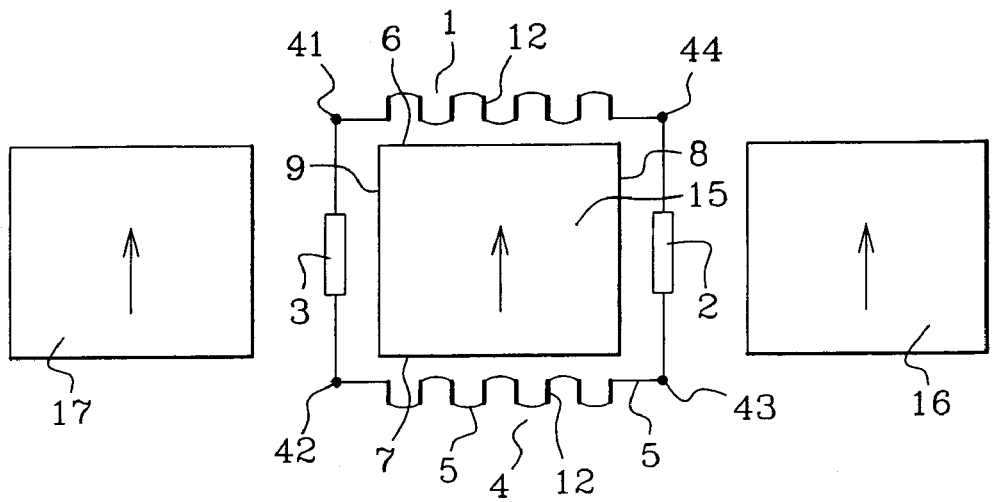
FIG. 4 schematically represents a second example of an embodiment of the invention wherein the giant magnetoresistors forming a bridge are arranged on the same plane as a central magnet and around said magnet and wherein two of the magnetoresistors are arranged so as to be also in the field of two additional magnets.

In this way, according to a second example of an embodiment of the invention, represented in FIG. 4, wherein, as in the case discussed with reference to FIG. 3, the four magnetoresistors 1–4 form a plane quadrilateral, additional magnets 16, 17 are arranged at either side of the magnetoresistors 2 and 3, respectively. In this way, the magnetoresistor 2 belonging to the second pair of magnetoresistors is enclosed between the central magnet 15 located in the quadrilateral formed by the four magnetoresistors 1–4 and the magnet 16. Similarly, the magnetoresistor 3 also belonging to the second pair of magnetoresistors is enclosed between the central magnet 15 and the magnet 17. Naturally, it is possible to envisage a configuration wherein the magnetoresistors of the first pair are each enclosed by magnets. In this way, in this embodiment, the two magnetoresistors polarised by main fields or two magnetoresistors polarised by leakage fields are also polarised by two additional magnets, one being arranged with respect to the central magnet 15 on the other side of a magnetoresistor outside the quadrilateral and the other being arranged with respect to the central magnet 15 on the other side of another magnetoresistor outside the quadrilateral. In the example illustrated with reference to FIG. 4, the additional magnets 16, 17 are located at either side of the magnetoresistors 2 and 3 polarised by the leakage fields. The additional magnets 16 and 17 are arranged such that the main field of said magnets is parallel with the field of the central magnet 15 and the leakage faces of said magnets are roughly centred on a central axis of the leakage faces of the central magnet 15. Under these conditions, the leakage field created for example by the magnet 16 is added to the leakage field created by the magnet 15 at the magnetoresistor 2 which is positioned between these two magnets. The effect of the additional magnets 16 and 17 is thus analysed as a reinforcement of the amplitude of the polarisation field of the GMR, and as an enlargement of the homogeneity zone of the field. The same applies symmetrically for the magnetoresistor 3 and the additional magnet 17. In the example shown where the homogeneous zone in the direction Oz in the vicinity of the faces 6 and 7 is relatively short, the magnetoresistors 1 and 4 are presented in the form of several longitudinal fingers 12 connected in series preferentially by components produced from the same material as that forming the magnetoresistors, or by conductive components 5. Each of the fingers 12 has its longitudinal axis parallel with the main field of the magnets 15–17. The fingers are positioned parallel with each other such that all the fingers occupy a homogeneous field zone. In practice, in order to simplify manufacture, the fingers of a magnetoresistor are identical with each other, spaced at regular intervals and occupy a rectangular zone. This arrangement is in no way obligatory and, for example, the fingers could occupy a zone between two curves, and the central fingers having for example greater longitudinal dimensions than those of the more lateral fingers, so as to conform better to the homogeneous zone of the field. The magnetoresistors 2 and 3 located in zones parallel with the faces 8 and 9, respectively, where the field is homogeneous on a zone which is extensive in the direction Oz and narrow in the direction Oy, come in the form of a single longitudinal finger wherein the longitudinal axis is also parallel with the main field of the magnets 15–17.

Figure 5:
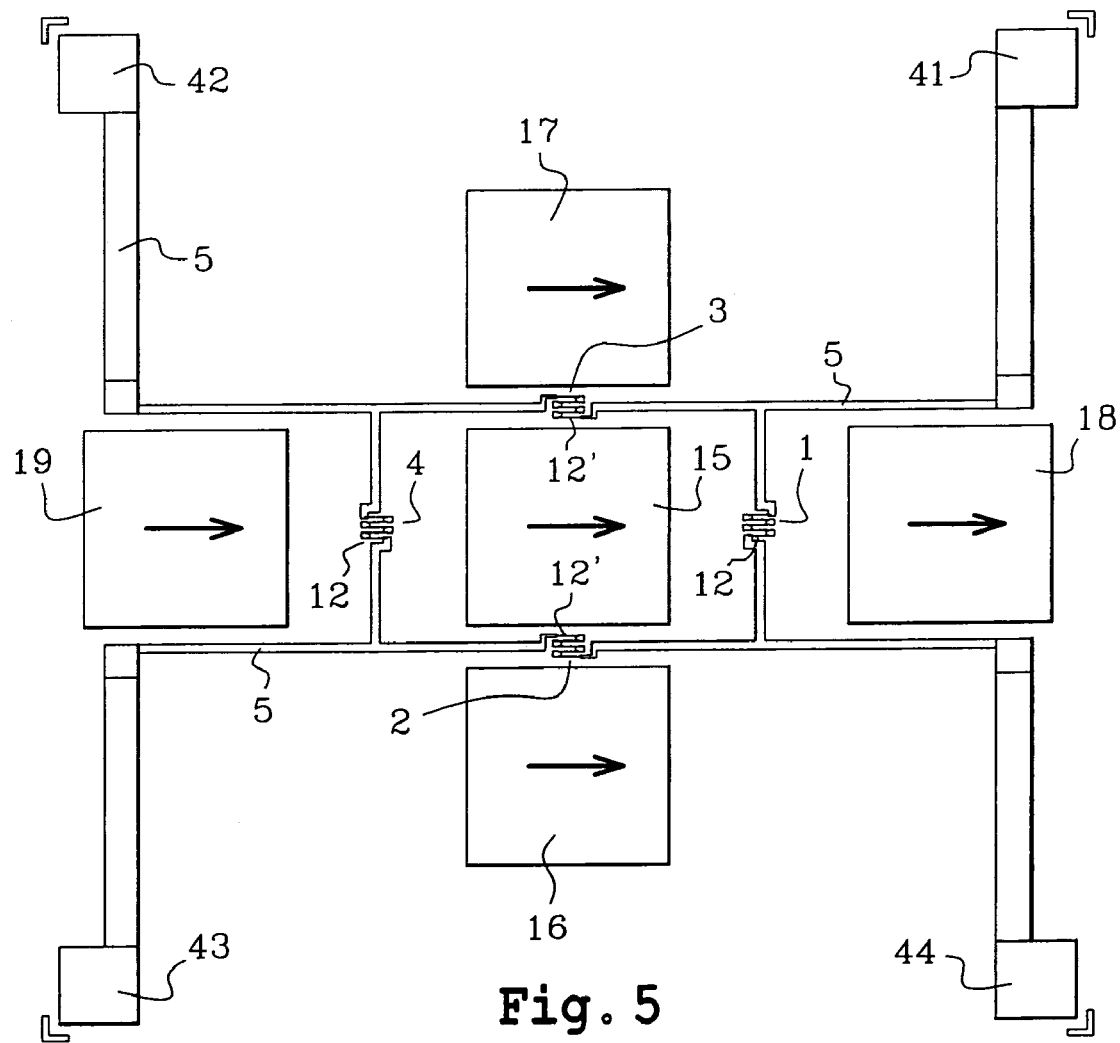
FIG. 5 schematically represents a third example of an embodiment of the invention wherein the four giant magnetoresistors forming a bridge are polarised by a central magnet and four additional magnets and wherein each magnetoresistor is arranged so as to be in a field of the central magnet and in the field of an additional magnet.

In the preferred embodiment, represented in a top view in FIG. 5, each of the magnetoresistors 1–4 forming the bridge is enclosed between two magnets. In this way, as in the case described with reference to FIG. 4, a first additional magnet 16, is arranged on the other side of the magnetoresistor 2 with respect to the central magnet 15. A second additional magnet 17 is arranged on the other side of the magnetoresistor 3 with respect to the central magnet 15. In addition, a third additional magnet 18 is arranged on the other side of the magnetoresistor 1 with respect to the central magnet 15 and a fourth additional magnet 19 is arranged on the other side of the magnetoresistor 4 with respect to the central magnet 15. The magnets 16–19 are all located on the same level as the magnetoresistors 1–4 and their main magnetisations are parallel with each other. As in the above case, the additional magnets increase the value of the field present at each magnetoresistor and enlarge the homogeneity zones of the field at the points where the magnetoresistors are positioned. The magnetoresistor positioning precision constraint with respect to the faces of the magnets is thus reduced further. The homogeneity zones are in this case sufficiently enlarged for it to become possible for the magnetoresistors 1–4 to be constructed in the same way as shown in FIG. 5, with, in particular, the same number of fingers. Naturally, according to the polarisation field values and according to the shape of the magnets, the number and shape of the magnets may be different between the magnetoresistors 1, 4 polarised by the main fields of the magnets 15, 18, 19 and the magnetoresistors 2, 3 polarised by the leakage fields of the magnets 15–17.

In FIG. 5, the conductive lines 5 join together as well as the consecutive fingers of a magnetoresistor, the magnetoresistors 1–4 to form the bridge.

To sum up, in this embodiment, the magnetoresistors are polarised by the central magnet 15 and by four additional magnets arranged outside the quadrilateral, two of the additional magnets 18, 19 arranged on either side of the central magnet 15, having their main polarisations located on the axial line of the central magnet 15 and the two other additional magnets 16, 17 arranged on either side of the central magnet 15 having their main polarisations located on axial lines parallel with that of the central magnet 15, separate from each other and separate from the axial line of the central magnet 15.

Figure 6:
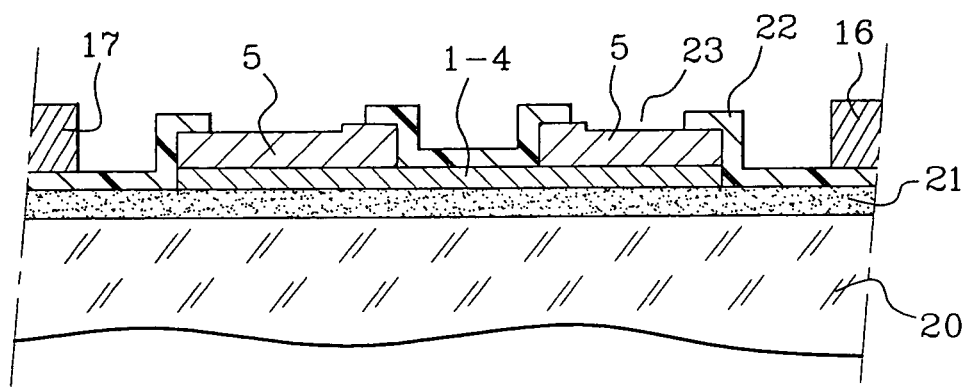
FIG. 6 schematically represents an example of a technological embodiment of the layers forming the structure of a magnetic field sensor according to the invention.

An example of an arrangement of layers to produce the magnetoresistors, magnets and insulations and contacts will now be described with reference to FIG. 6. This figure represents a cross-section of a part of the bridge structure. On a silicon substrate 20, an insulating layer 21, for example made of silica, is first of all deposited. The material forming the magnetoresistors 1–4 is then deposited on the entire surface of the substrate. This may for example consist of multilayer FeNiAg deposited by means of cathodic evaporation. The multilayer deposited in this way is then engraved as required to form the different fingers oriented as described above.

After the parts not to comprise conductive lines have been masked, the conductive lines 5 and the contact blocks are deposited. The conductive lines 5 connect the different fingers together in order to place them in series, closing the bridge formed by the 4 magnetoresistors. The conductive depositions are carried out for example with Au or Cu or any other conductive metal or alloy, deposited for example by cathodic evaporation, or by vacuum evaporation or by electrolytic deposition or by any other means. The insulating layers 22, for example made of $SiO_2$ or $Si_3N_4$ or resin or any other insulator, are then deposited, intended to galvanically separate the magnets and the magnetoresistors equipped with their conductive lines 5 and their contacts. The magnets 16–19 are then deposited, for example by electrochemical means. This may consist of a ferromagnetic alloy or a multilayer stack of ferromagnetic materials such as Co, Fe and other non-ferromagnetic materials such as Pt, Cu, Ag or Pd. The examples of materials are not restrictive. The deposited layer is then etched to delimit the magnets. The insulating layer 21 is then opened at the electrical contact pickup sites 23. In this way, in this configuration, the magnets and the magnetoresistors are located on the same level, apart from the thickness of the insulating layer 22.

Figure 7:
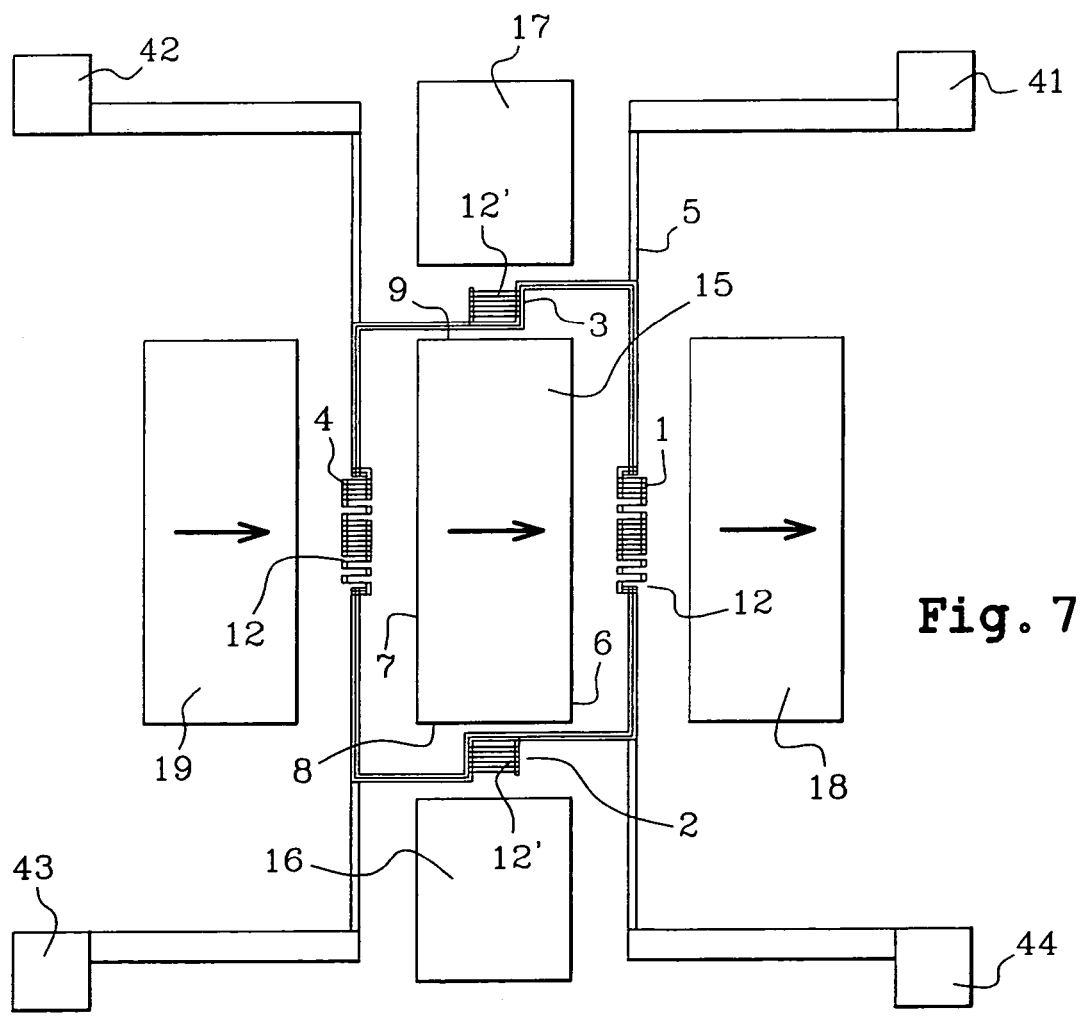
FIG. 7 schematically represents a fourth example of an embodiment of the invention wherein the four giant magnetoresistors forming a bridge are polarised by a central magnet and four rectangular or square additional magnets and wherein each magnetoresistor is arranged so as to be in a field of the central magnet and in the field of an additional magnet.

FIG. 7 represents an example of an embodiment comprising, as in the case shown with reference to FIG. 5, a central magnet 15 arranged at the centre of a quadrilateral formed by the four magnetoresistors of the bridge, and four additional magnets 16–19 arranged on either side of a magnetoresistor with respect to the central magnet 15. In the configuration shown in FIG. 7, the central magnet has a rectangular shape with a dimension along the main magnetisation direction that is less than the transverse dimension. The magnets 18 and 19 located respectively on either side of the resistors 1 and 4, located in the main magnetic field, have the same rectangular shape as the central magnet 15. The magnetoresistors 1 and 4 are formed from the same number of identical fingers 12. Similarly, the magnetoresistors 2 and 3 located in the leakage fields of the magnets 15, 16 and 15, 17, respectively, have the same number of identical fingers 12'. The number of fingers of the magnetoresistors 2, 3 located in the leakage fields is less than the number of fingers of the magnetoresistors 1, 4 located in the main fluxes. On the other hand, to obtain equality of the four magnetoresistors, the fingers 12' of the magnetoresistors 2, 3 located in the leakage fields are longer than the fingers 12 of the magnetoresistors 1, 4 located in the main fields.

Figure 8:
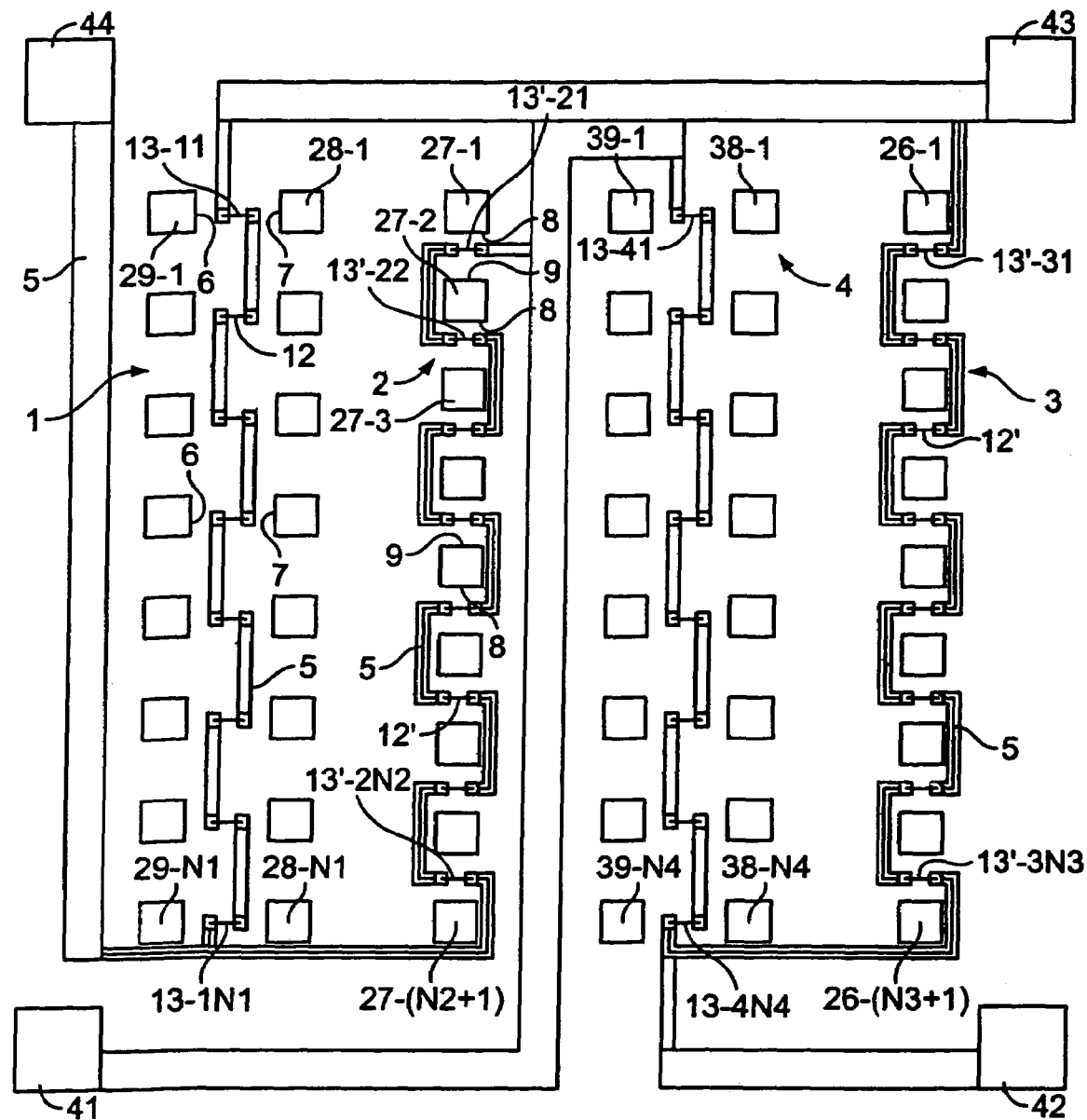
FIG. 8 schematically represents a fifth example of an embodiment of the invention wherein each magnetoresistor comes in the form of a series of groups of longitudinally shaped fingers, each group being polarised by a magnet or a pair of magnets specific to said group.
Figure 9:
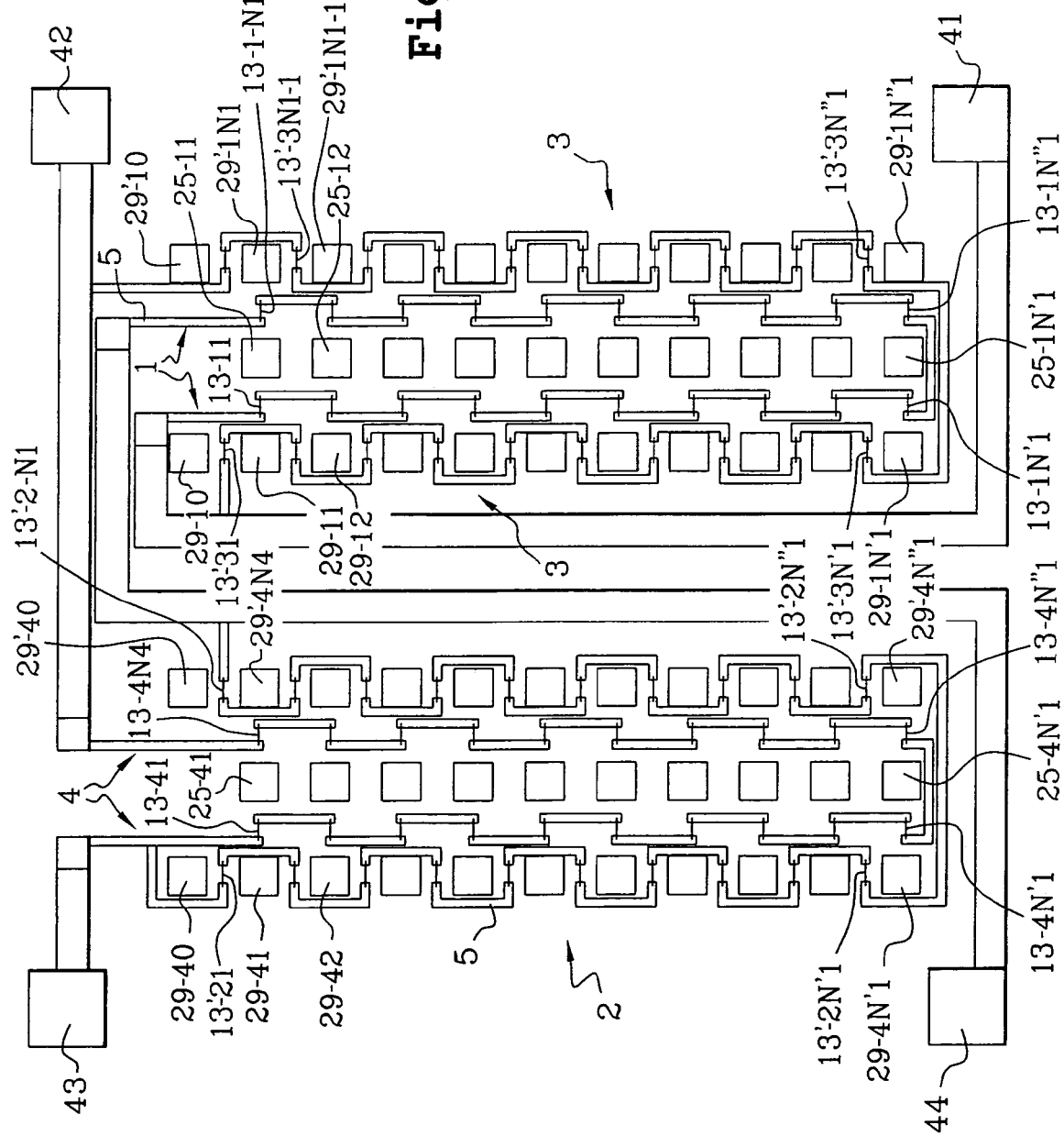
FIG. 9 represents another example of an embodiment similar to that represented in FIG. 8 wherein series of fingers forming magnetoresistors are physically folded onto themselves.

With reference to FIGS. 3, 4, 5 and 7, examples of embodiments wherein the four magnetoresistors 1–4 form a plan quadrilateral and where each magnetoresistor is polarised by one or two magnets were discussed. This configuration is in no way mandatory. With reference to FIGS. 8 and 9, examples of embodiments wherein the four magnetoresistors are arranged on axial lines parallel with each other will be discussed below. More specifically, each of the magnetoresistors 1–4 is formed by fingers 12 or 12' wherein the longer dimension is positioned parallel with Oz. These fingers are connected with each other in series by conductors 5. The geometric centres of the fingers of the magnetoresistors are aligned along directions parallel with Oy. The dimensions of the magnetoresistors formed in this way are markedly greater in the direction Oy than in the direction Oz; for this reason the magnetoresistors 1–4 are said to be on axial lines parallel with each other. The direction Oz is the axial magnetisation direction of a set of magnets which will be discussed below. The first magnetoresistor 1 is formed by a first set of N1 first groups of fingers 12. The groups of fingers are referenced in FIGS. 8 and 9, 13-11 to 13-1N1 for the groups of fingers of the first magnetoresistors, 13'-21 to 13'-2N2 for the groups of fingers of the second magnetoresistors, 13'-31 to 13'-3N3 and 13-41 to 13-4N4 for the groups of fingers of the third and fourth magnetoresistors. The fingers of each group and the groups are connected in series such that each resistor comprises a number of fingers connected in series which is equal to the number of fingers of each group multiplied by the number of groups forming a magnetoresistor together. The numbers N1, N2, N3, and N4 are integers greater than 1. In FIGS. 8 and 9, in order to simplify the figure, each group only comprises one finger. With reference to FIG. 8, each group of N1 fingers is polarised by the main field of one or two magnets. Therefore, there are N1 or 2N1 magnets. In the representation in FIG. 8, an example wherein there are 2N1 magnets referenced 29-1 to 29-N1 and 28-1 to 28-N1 has been represented. Each of the fingers of the N1 groups of fingers has its longitudinal direction, perpendicular to the main flux faces 6, 7 of two magnets 28, 29 of the same rank, forming a main field polarisation pair together, and each group has its geometric centre located at the centre of the main field zone, on a central axis of said faces. In this way, for example, the group 13-1 of fingers is located between the face 6 of the magnet 29-1 and the face 7 of the magnet 28-1, and so on up to the group 13-1N1 of fingers 12 which has its geometric centre between the face 6 of the magnet 29-N1 and the face 7 of the magnet 28-N1. The magnets 29 and 28 are, in the example represented in FIG. 8, all similar with each other. The fourth magnetoresistor 4 consists in the same way of a set of N4 fourth groups of fingers 12 referenced 13-41 to 13-4N4 arranged in the same way each between a face 6 of a magnet 39 and a face 7 of a magnet 38. In this way, each of the groups of fingers 12 forming the magnetoresistors 1 and 4 are polarised by the main field of a specific magnet or pair of magnets, the two magnets of each pair being located on the same axial line parallel with the axial magnetisation direction of the two magnets. The magnetoresistor 2 also consists of a set of N2 second groups 13'-21 to 13'-2N2 of fingers 12'. The fingers 12' of each second group 13'2 and the N2 groups are connected in series such that each resistor comprises a number of fingers connected in series which is equal to the number of fingers 12' of each group multiplied by the number N2 of groups. The polarisation magnets of the N2 groups are in this embodiment example arranged in a column. Each of the N2 groups 13'-2 of fingers is positioned between the leakage faces 8, 9 of two consecutive magnets 27 of the column. In this way, the group 13'-21 is positioned between the leakage face 8 of a magnet 27-1 and the leakage face 9 of a magnet 27-2, the group 13'-22 is positioned between the leakage face 8 of the magnet 27-2 and the leakage face 9 of a magnet 27-3, and so on up to a second group of fingers 13'-2N2 which is positioned between the leakage face 8 of a magnet 27-N2 and the leakage face 9 of a magnet 27-(N2+1). In this way, if there are N2 groups of fingers 12', there are (N2+1)

magnets 27. Each of the N2 second groups of fingers 12' is thus polarised by the leakage fields of two consecutive magnets 27. Finally, the magnetoresistor 3 is composed and arranged in the same way as the magnetoresistor 2, meaning that the magnetoresistor 3 is formed by a number N3 of third groups 13' of fingers 12'. Each third group of fingers is polarised by the leakage fields of two consecutive magnets 26 referenced 26-1 to 26-(N3+1) of a column of magnets. The fingers of a group are connected together by components 5 consisting of the same material as the fingers. The groups of fingers and the magnetoresistors 1–4 are connected electrically together by conductors 5 ended with contact blocks 41–44 providing the junction connection of two consecutive magnetoresistors with the outside. It is important to note that, in order to simplify design and manufacture, the numbers N1 and N4 will generally be equal. The magnets 29, 28 and 39, 38 polarising the magnetoresistors 1, 4 will be identical with each other and identical to those 27, 26 polarising the magnetoresistors 2, 3. The fingers 12 will be preferentially identical with each other. In the example represented in FIG. 8, the magnets 28–29 and 38, 39 polarising the magnetoresistors 1, 2 respectively are arranged in 4 parallel columns. This arrangement is advantageous since it enables a saving of space on a chip comprising the structure, but it is necessary to note that it is not mandatory. Each first and fourth group of fingers simply needs to be between the main flux faces of two magnets, the shape of the links 5 being adapted in this case for the position selected for the fingers 12 of the magnetoresistors 1, 4. The column arrangement of the magnets 26, 27 of the magnets polarising the magnetoresistors 2, 3 is not mandatory either, although it enables considerable saving of space, each magnet with the exception of the terminal magnets of the column polarising two groups of fingers 12'.

To sum up, in the embodiment described with reference to FIG. 8, the fingers forming together the first magnetoresistor 1 are divided into a first set of N1 first groups of fingers, the fingers forming together the fourth magnetoresistor 4 are divided into a fourth set of N4 fourth groups of fingers, in that the fingers 12' forming together the second magnetoresistor 2 are divided into a second set of N2 second groups of fingers 12', and in that the fingers forming together the third magnetoresistor are divided into a third set of N3 third groups of fingers 12'. Each of the first groups of fingers is positioned in the main field of a or a pair of separate magnets such that there are N1 or 2N1 polarisation magnets of the first magnetoresistor, each of the fourth groups of fingers is positioned in the main field of a or a pair of separate magnets such that there are N4 or 2N4 polarisation magnets of the fourth magnetoresistor, each of the third groups of fingers is positioned in the leakage field of two consecutive separate magnets, said consecutive separate magnets being arranged in a column such that there are (N3+1) polarisation magnets of the third magnetoresistor 3, each of the second groups of fingers is positioned in the leakage field of two consecutive separate magnets, said consecutive separate magnets being arranged in a column such that there are (N2+1) polarisation magnets of the second magnetoresistor.

A similar embodiment in terms of principle to that in FIG. 8 will now be described with reference to FIG. 9.

In this embodiment, the magnetoresistors 1–4 are, as in the previous case, divided respectively into N1–N4 groups of fingers. The N1 and N4 groups of fingers forming the first and fourth magnetoresistors together respectively are aligned in at least two parallel columns. FIG. 9 represents two columns for each of the magnetoresistors 4 and 1. The first column of fingers of the magnetoresistor 1 represented in the right part of the figure, comprises the groups of fingers referenced 13-11 to 13-1N'1, the second column comprises the groups of fingers 13-1N"1 to 13-1N1. Similarly, the first column of fingers of the magnetoresistor 4 represented in the left part of FIG. 9, comprises the groups of fingers referenced 13-41 to 13-4N'4, the second column comprises the groups of fingers 13-4N"4 to 13-4N4. The numbers N'1 and N"1 are between 2 and N1 but [N41+(N1-N"1+1)] is not necessarily equal to N1. The same applies for the groups of fingers forming the magnetoresistor 4. This expresses that all the groups of fingers forming the magnetoresistor 1 or the magnetoresistor 4 are not necessarily all comprised in the two columns of fingers for each of the magnetoresistors 1 and 4, respectively. In the example shown, all the groups of fingers of the magnetoresistors 1 and 4 are divided into both columns of groups of fingers of each of the magnetoresistors. Preferentially, as shown in FIG. 9, the numbers N1 and N4 are even and each of the columns comprises the same number of groups of fingers. In this case, $N'1=N1/2$, $N"1=N1/2+1=N'1+1$ and $N'4=N4/2$, $N"4=N4/2+=N'4+1$. In this way, groups of fingers of each of the first and fourth magnetoresistors respectively are divided into pairs. Each pair comprises a first member and a second member. The first member of a pair is located both in the incoming field zone of a central magnet 25 and in the outgoing field zone of a first lateral magnet 29. The second member of said pair is located both in the outgoing field zone of said central magnet 25 and in the incoming field zone of a second lateral magnet 29'. The first and second lateral magnets 29, 29' and the central magnets 25 form columns of magnets parallel with each other. In this way, for example, a first column of lateral magnets polarising the first magnetoresistor 1 comprises the first magnets referenced 29-11 to 29 1N'1. The column of central magnets 25 comprises the magnets 25-11 to 25-1N'1 and the second column of second lateral magnets 29' comprises the magnets referenced 29'1N'1+1 to 29'1N1. The first pair of groups of fingers has a first member 13-11 located both in the outgoing main field zone of the first lateral magnet 29-11 of the first column of lateral magnets and in the incoming main field zone of the first central magnet 25-11. The first pair of groups of fingers has a second member 13-1N1 located both in the outgoing main field zone of the first central magnet 25-11 of the column of central magnets and in the incoming main field zone of the last second lateral magnet 29'-1N1 of the second column of lateral magnets 29'. Similarly, the second pair of groups of fingers has a first member located both in the outgoing main field zone of the second first lateral magnet 29-12 of the first column of lateral magnets and in the incoming main field zone of the second central magnet 25-12. The second pair of groups of fingers has a second member located both in the outgoing main field zone of the second central magnet 25-12 of the column of central magnets and in the incoming main field zone of the second second lateral magnet 29'-1N1−1 of the second second column of lateral magnets polarising the first magnetoresistor. The same applies until the last pair of groups of fingers of the first magnetoresistor wherein the first member 13-1N'1 is located both in the outgoing main field zone of the last first lateral magnet 29-1N'1 of the first column of lateral magnets 29 and in the incoming main field zone of the last central magnet 25-1N'1. The last pair of groups of fingers has a second member located both in the outgoing main field zone of the last central magnet 25-1N'1 of the column of central magnets and in the incoming main field zone of the last second lateral magnet 29'-1N"1 of the second column of lateral magnets polarising the first magnetoresistor.

The fourth magnetoresistor has its groups of fingers arranged in the same way. The first member of each group pair is arranged in the main field zone between two magnets, a first belonging to a first lateral column of magnets 29-4, and a central magnet 25-4 of a column of central magnets polarising the fourth magnetoresistor. The second member of each pair of groups of fingers is arranged in the main field zone between two magnets, a central magnet 25-4 of the column of central magnets 25-4 polarising the fourth magnetoresistor and a second belonging to a second lateral column of magnets 29'-4.

If, as represented in FIG. 9, all the fingers forming together the first and fourth magnetoresistors respectively are divided into pairs such that the numbers N1 and N4 are even integers, there are 3N1/2 polarisation magnets of the first magnetoresistor 1 divided into three parallel columns each comprising at least N1/2 magnets, and 3N4/2 polarisation magnets of the fourth magnetoresistor 4 divided into three parallel columns each comprising at least N4/2 magnets.

The distribution of the groups 13' or fingers 12' forming the magnetoresistors 2 and 3 will now be discussed.

In the embodiment represented in FIG. 9, groups 13' of fingers 12' forming together the second and third magnetoresistors are located in the leakage field zones of two consecutive magnets of columns of lateral magnets.

More specifically, in the embodiment represented in FIG. 9, where the magnetoresistors 1–4 have the same number of groups of fingers, each interval between two consecutive magnets 29-4, 29'-4 or 29-1, 29'-1 of the columns of lateral magnets 29 separately house one of the groups of fingers forming the magnetoresistors 2 and 3. In this way, for example, N'1–1 groups of fingers referenced 13'–31 to 13-3(N'1–1) forming together a part of the third magnetoresistor 3 are each housed separately in the (N'1–1) intervals between the N'1 first magnets forming together the first column of lateral magnets 29-11 to 29-1N'1 polarising the magnetoresistor 1. Similarly, N"1–1 groups of fingers referenced 13'-3N"1 to 13'-3(N1–1) forming together another part of the third magnetoresistor 3 are each housed separately in one of the intervals between the second lateral magnets 29'-1N"1 to 29'-1N1 of the second column of lateral magnets polarising the first magnetoresistor 1.

The same applies for the groups of fingers forming together the magnetoresistor 2 which are housed in the intervals between the lateral magnets 29-4 and 29'-4 of the first and second columns respectively of magnets polarising the magnetoresistor 4.

It can be seen that, in view of the number of intervals between consecutive magnets of the columns of lateral magnets, an interval is lacking in each of the columns to house one of the groups of magnetoresistor fingers polarised by leakage fields. To create this lacking interval, each column of lateral magnets comprises an additional magnet. These magnets have been referenced 29-10 and 29'10 for the two columns of lateral magnets polarising the magnetoresistor 1 and 29–40, 29'40 for the two lateral magnets polarising the magnetoresistor 4.

More generally, in order to define the embodiments as represented in FIGS. 8 or 9, it can be said that the polarisation magnets are arranged in the form of a matrix into rows and columns, in that the fingers forming together each magnetoresistor are divided into groups of fingers and in that groups of fingers belonging to magnetoresistors polarised by main fields are housed in the main field zones between magnets of consecutive columns belonging to the same row and in that groups of fingers belonging to magnetoresistors polarised by leakage fields are housed in leakage field zones between consecutive magnets belonging to the same column.

If the bridge is a dividing bridge, it only comprises two magnetoresistor; for example, the magnetoresistors 1 and 3 represented in FIG. 9. In this case, it comprises at least 3 columns of magnets, divided into one central column and two lateral columns. Groups of fingers housed in the leakage field zones are only present between consecutive magnets belonging to the lateral columns. If the bridge is a Wheatstone bridge, there are four magnetoresistors and, in this case, there are at least two pairs of 3 columns as shown in FIG. 8.

In the embodiment represented in FIG. 9, which is preferred, the magnet of the first row of each central column of magnets 25 is absent. A group of fingers housed in the leakage field zones between consecutive magnets belonging to the lateral columns is present in each of the intervals between consecutive magnets of said columns. A group of fingers belonging to magnetoresistors polarised by main fields is present between each of the intervals between consecutive magnets of the same row, with the exception of the first.

Naturally, it is possible to use the columns of central magnets 25-4 or 25-1 to house groups of fingers in the leakage zones between consecutive magnets of said columns. However, it should be noted that it is then necessary for the conductors 5 connecting the groups of consecutive fingers forming for example the magnetoresistors 1 and 3 to intersect, which requires the deposition of an insulating material between layers of conductors 5 and therefore complicates manufacture. In the configurations represented in FIGS. 8 or 9, it is noted that there is no intersection between the magnetoresistor conductors 5. In this way, for example, in the embodiment represented in FIG. 9, the magnetoresistor 1 formed by the groups 13 of fingers 12 and the conductors 5 has an overall U shape. The same applies for the groups 13' of fingers 12' and the conductors 5 forming the magnetoresistor 3 together. The U of the magnetoresistor 3 is entirely located outside and around the U forming the magnetoresistor 1. There is thus no intersection between conductors 5 of these two magnetoresistors.

With respect to the embodiment represented in FIG. 8, the embodiment in FIG. 9, particularly its preferred embodiment, makes it possible to house a greater number of fingers on the same surface area due to the fact that, with the exception of the first row, all the intervals between consecutive magnets of the magnet matrix are used. It is therefore possible to obtain high-value magnetoresistors, and use high bridge voltages while circulating low currents in the magnetoresistors.

Figure 10:
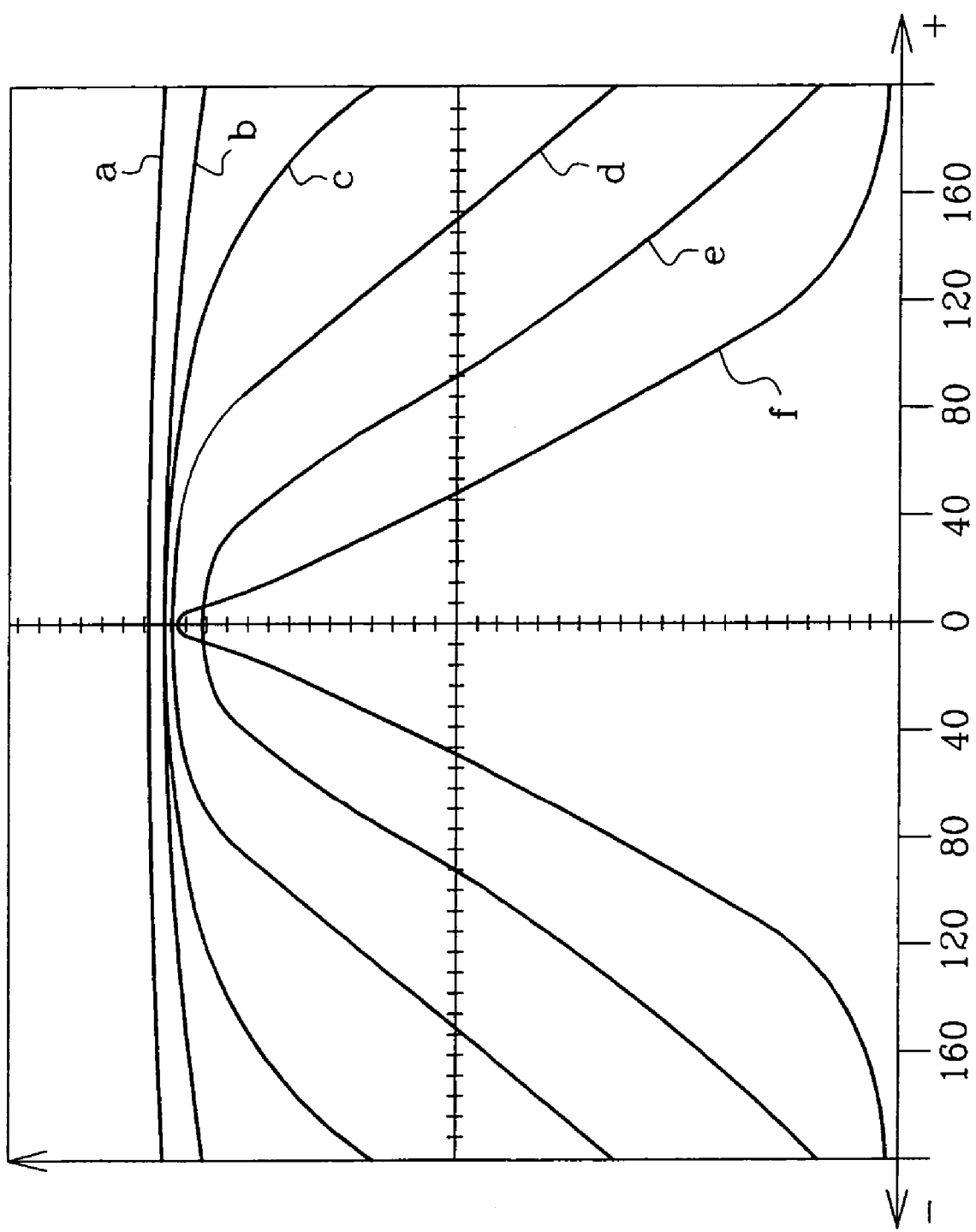
FIG. 10 is a set of curves a–f which each represent the variation of a magnetoresistor as a function of the magnetic field wherein it is located. Curves a–e relate to the prior art and curve f to a magnetoresistor positioned according to the invention.

Comparisons with the prior art and calculated examples of embodiments will now be discussed with reference to FIGS. 10 and 11 which represent curves.

In the discussion of the prior art above, it was explained that the variation curve of a magnetoresistor in the shape of a rectangular bar and polarised along its width showed a plateau. Curves a to e of FIG. 10 represent the variation of magnetoresistors consisting of rectangular bars all 0.05 µm thick, 64 µm long and widths of 1 µm for curve a, 2 µm for curve b, 4 µm for curve c, 8 µm for curve d and 16 µm for curve e. These magnetoresistors are polarised transversally. A plateau effect, in the vicinity of 0, can be seen in these curves. The magnetoresistor represented on the Y-axis practically does not vary when the magnetic field represented on the X-axis has a positive or negative value, which does not exceed a certain threshold. This threshold increases as the width of the magnetoresistor decreases. Curve f represents the variation in the magnetoresistor for a bar 0.05 μm thick, 64 μm long and 4 μm wide, therefore identical to that in curve c, but polarised longitudinally. It can be seen that this curve shows a linear variation with the field practically from the value 0, up to a field value of approximately 120 Oersteds corresponding to saturation. It should be noted that, for this value, the same bar polarised transversally is still in its plateau part. This results in a structure according to the invention incorporated in a sensor that is able to measure much weaker fields with the same magnetoresistor shapes.

Figure 11:
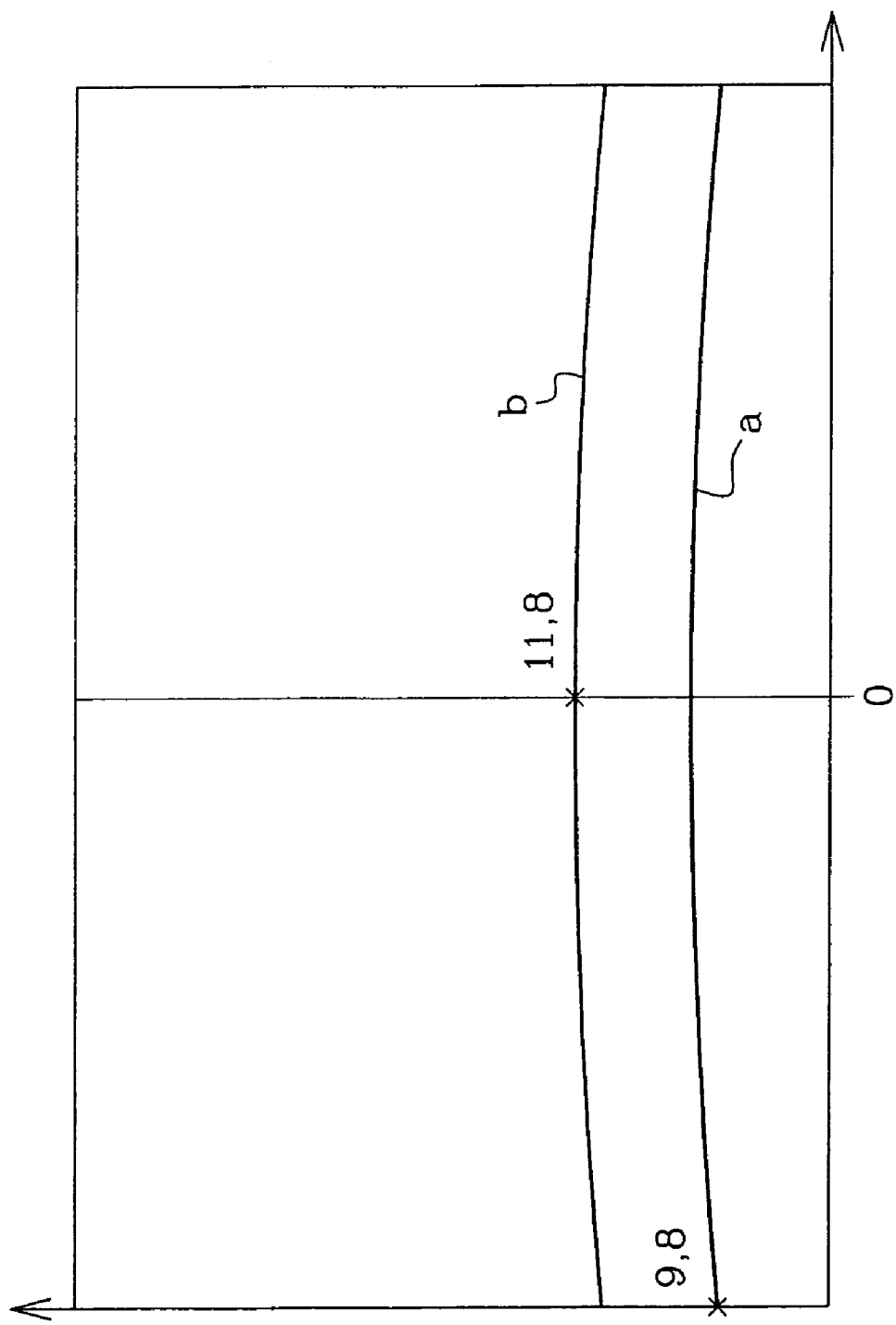
FIG. 11 is a set of two curves which represent the minimum and maximum values of the magnetic field at the same distance from the side of a magnet and as a function of the distance in a direction perpendicular to the field for a device according to the invention.

FIG. 11 illustrates the variations of the field inside magnetoresistors polarised with a single magnet positioned at the centre of a quadrilateral formed by the 4 magnetoresistors forming the bridge, as illustrated in FIG. 3. The central magnet 15 has dimensions of 500×500 μm$^2$ and a thickness of 4 μm. It comprises a residual magnetisation of 5000 Gauss. The magnetoresistor 1 consists of ten fingers connected in series. Each finger is 20 μm long and 4 μm wide. The thickness of each finger is 0.05 μm. The interval between consecutive fingers is 10 μm. The centre of each finger is positioned at a distance of 200 μm from the face 6 of the main flow of the magnet. The fingers thus form together a rectangle wherein the largest dimension is approximately 130 μm and wherein the smallest dimension is 20 μm. The geometric centre of this magnetoresistor is the geometric centre of the rectangle. It is located on the central axis of the face 6 at a distance of 200 μm from said face. Curves a and b in FIG. 11 represent on the Y-axis the value of the polarisation field in Oersteds as a function of the X-axis value in the direction perpendicular to the main magnetisation direction of the magnet 15. The X-axis values are measured from −70 μm to +70 μm, i.e. from the first to the last finger of the magnetoresistor 1. Curve a represents the value of the field at 210 μm from the face 6 of the magnet, i.e. at the most distant edge of the magnetoresistor 1 from the face 6 of the magnet. Curve b represents the value of the field at 190 μm from the face 6 of the magnet, i.e. at the closest edge of the magnetoresistor 1 from the face 6 of the magnet. Under these conditions, it can be seen that the maximum deviation in the field value in the magnetoresistor 1 is two Oersteds, the maximum field value being 11.8 and the minimum value being 9.8 Oersteds.

In the same configuration with a single magnet, the magnetoresistors 2 and 3 polarised by the leakage fields consist of a single finger 200 μm long and 4 μm wide. These magnetoresistors are positioned with their longitudinal axis parallel with the leakage faces 8, 9. The geometric centre of the finger is positioned 25 μm from the face. Under these conditions, the maximum variation of the field in each magnetoresistor is 1.75 Oersteds between a maximum value of 12 Oersteds and a minimum value of 10.25 Oersteds.

The results obtained with the polarisation configuration described with reference to FIG. 4 will now be described. The magnetoresistors 2 and 3 are each polarised with the leakage fields of two magnets, the central magnet 15 and an additional magnet 16, 17. The 3 magnets 15–17 are identical to the single magnet 15 described above. The magnetoresistors 1 and 4 consist of 10 identical 20×4 μm fingers, with a 10 μm interval between fingers. The magnetoresistors 1 and 4 thus each occupy a surface area of 130×20 μm. The large dimension of each magnetoresistor extends parallel with the faces 6 and 7, respectively. The geometric centre of said magnetoresistors is at a distance of 130 μm from the faces 6, 7 respectively. The simulation demonstrates that the mean field is 19.7 Oersteds with a maximum field of 22 Oersteds and a minimum field of 17.5 Oersteds.

The magnetoresistors 2 and 3 consist of a single 200×4 μm bar having its geometric centre positioned 50 μm from the leakage faces 8 and 9, respectively, the leakage faces opposite the magnets 15, 16 and 15, 17 being at 100 μm intervals. The simulation demonstrates that the mean field is −19.2 Oersteds with a maximum field of −20.2 Oersteds and a minimum field of −18.2 Oersteds. By means of the two additional magnet enclosing the magnetoresistors 2 and 3, the homogeneous field surface area is increased such that is becomes possible to envisage having identical shapes for the 4 magnetoresistors.

An example of a configuration with a central magnet 15 and 4 additional magnets 16–19 as represented in FIG. 5 will now be discussed. The 5 magnets are identical to each other and identical to the description given for the single magnet 15. The four magnetoresistors 1–4 are identical with each other. Each consists of 5 fingers 40 μm long and 4 μm wide. The interval between consecutive fingers of a magnetoresistor is 10 μm. In this way, each magnetoresistor occupies the surface area of a 40×60 μm rectangle. The interval between the faces opposite the magnet 15 and each of the magnets 18, 19 is 100 μm. The interval between the faces opposite the magnet 15 and each of the magnets 16, 17 is 440 μm. The geometric centres of the magnetoresistors are mid-distance from the 2 magnets polarising them. The polarisation values obtained are as follows for the magnetoresistors 1, 4, the mean field is 16.46+/−0.09 Oersteds. For the magnetoresistors 2, 3, the mean field is −16.99+/−0.19 Oersteds. It is noted that with this configuration, a very homogeneous field and very well balanced bridge are obtained.

APPENDIX

List of Relevant Documents of the Prior Art

[1] Article by Wanjun Ku, Paulo Compadrinho and Jose Barata entitled "Precision X–Y robotic object handling using a dual GMR bridge sensor", IEE Transaction on magnetics. Vol 36 No. 5 September 2000.

The invention claimed is:

1. Sensor comprising magnets and a bridge of magnetoresistors (1–4), said magnets and magnetoresistors being deposited in the form of layers on a same substrate (20), the magnetoresistors (1–4) each having a longitudinal direction, the bridge comprising two magnetoresistors (1, 3) or a first (1, 4) and a second (2, 3) pair of magnetoresistors, each magnetoresistor (1–4) being polarised by one or more magnets (15–19; 26–29; 38, 39), each magnet generating a magnetic field having two main magnetisation field zones, one incoming field zone and one outgoing field zone, aligned along a main magnetisation direction, and two magnetic leakage field zones, the first (1) of the two magnetoresistors (1, 3) of the bridge or each of the magnetoresistors (1, 4) of the first pair of magnetoresistors of the bridge being arranged in a main magnetisation field zone and the other magnetoresistor (3) or each of the magnetoresistors of the second pair (2, 3) of magnetoresistors of the bridge being arranged in a magnetic leakage field zone so that the two magnetoresistors (1, 3) or the magnetoresistors (1, 4; 2, 3) of each pair are polarised by magnetic fields of opposite directions, said magnets (15–19; 26–29; 38, 39) being substantially at the same height over the substrate as the magnetoresistors (1–4), wherein all the magnets (15–19;

26–29; 38, 39) have the same main magnetisation direction contained in the plane of the layers and the magnetoresistors (1–4) of the bridge have their longitudinal direction parallel with said main magnetisation direction.

2. A sensor according to claim 1, wherein two 1–4 or four the magnetoresistors (1–4) are produced in the form of one or more fingers (12, 12') connected in series, each finger (12, 12') having a longitudinal direction parallel with said main magnetisation direction.

3. A sensor according to claim 1 comprising a first (1, 4) and a second (2, 3) pair of magnetoresistors, wherein the first pair (1, 4) of magnetoresistors include a first and a fourth magnetoresistor and the second pair (2, 3) of magnetoresistors include a second and a third magnetoresistor, wherein the magnetoresistors (1–4) are each located on an arm of a quadrilateral, and in that polarisation is carried out by a central magnet (15), the magnetoresistors of the first pair of magnetoresistors (1, 4) being located on either side of the central magnet in the main magnetisation field zones and the magnetoresistors (2, 3) of the second pair of magnetoresistors being located on either side of the central magnet (15) in the magnetic leakage field zones.

4. A sensor according to claim 3, wherein the first and fourth magnetoresistors (1, 4) or the second and third magnetoresistors (2, 3) are also polarised by two additional magnets (16–19) outside the quadrilateral, one of which being arranged with respect to the central magnet (15) on the other side of a magnetoresistor (1, 4; 2, 3) and the other being arranged with respect to the central magnet (15) on the other side of another magnetoresistor (1, 4; 2, 3).

5. A sensor according to claim 3 wherein the magnetoresistors are also polarised by four additional magnets (16–19) arranged outside the quadrilateral, two of the additional magnets (18, 19) having their main polarisations located on a same axial line as that of the central magnet (15) and the two other additional magnets (16, 17) having their main polarisations located on axial lines parallel with that of the central magnet (15), separate from each other and separate from the axial line of the central magnet (15).

6. A sensor according to claim 3, wherein each of said first, second, third and fourth magnetoresistors is produced in the form of figures (12, 12') connected in series, each finger (12, 12') having a longitudinal direction parallel with said main magnetisation direction, the fingers (12) forming together the first magnetoresistor (1) being divided into a first set of N1 first groups of fingers, the fingers forming together the fourth magnetoresistor (4) being divided into a fourth set of N4 fourth groups of fingers, the fingers forming together the second magnetoresistor (2) being divided into a second set of N2 second groups of fingers, and the fingers forming together the third magnetoresistor (3) being divided into a third set of N3 third groups of fingers, where N1, N2, N3 and N4 are integers greater than 1, each of the first groups of fingers being positioned in the main magnetisation field zone of a magnet (28) or a pair (28, 29) of separate magnets such that there are N1 or 2N1 magnets for polarising the first magnetoresistor (1), each of the fourth groups of fingers being positioned in the main magnetisation field zone of a magnet (38) or a pair (38, 39) of separate magnets such that there are N4 or 2N4 magnets for polarising the fourth magnetoresistor, each of the third groups of fingers being positioned in the magnetic leakage field zone of two consecutive separate magnets (26), said consecutive separate magnets (26) being arranged in a column such that there are N3+1 magnets (26) for polarising the third magnetoresistor (3), each of the second groups of fingers being positioned in the magnetic leakage field zone of two consecutive separate magnets (27), said consecutive separate magnets (27) being arranged in a column such that there are N2+1 magnets for polarising the second magnetoresistor (2).

7. A sensor according to claim 3, wherein each of said first, second, third and fourth magnetoresistors is produced in the form of figures (12, 12') connected in series, each finger (12, 12') having a longitudinal direction parallel with said main magnetisation direction, the fingers (12) forming together the first magnetoresistor (1) being divided into a first set of N1 first groups (13-1) of fingers, the fingers (12) forming together the fourth magnetoresistor (4) being divided into a fourth set of N4 fourth groups (13-4) of fingers, the fingers (12') forming together the second magnetoresistor (2) being divided into a second set of N2 second groups (13'-2) of fingers, the fingers (12') forming together the third magnetoresistor (3) being divided into a third set of N3 third groups (13'-3) of fingers, where N1, N2, N3 and N4 are integers greater than 1, the groups (13-1; 13-4) forming together the first and the fourth magnetoresistor respectively being aligned in at least two parallel columns, groups (13-1; 13-4) of fingers of each of the first and fourth magnetoresistors (1, 4) respectively being divided into pairs, each pair comprising a first member and a second member, the first member of a pair being located both in the incoming field zone of a central magnet (25) and in the outgoing field zone of a first lateral magnet (29), the second member of said pair is located both in the outgoing field zone of said central magnet (25) and in the incoming field zone of a second lateral magnet (29'), the first (29) and second (29') lateral magnets forming columns of magnets parallel with each other.

8. A sensor according to claim 7, wherein all the groups (13-1; 13-4) of fingers (12) forming together the first and fourth magnetoresistors (1, 4) respectively are divided into pairs such that the numbers N1 and N4 are even integers, there are 3N1/2 magnets (25-1, 29-1, 29'-1) for polarising the first magnetoresistor (1), said 3N1/2 magnets being divided into three parallel columns each comprising N1/2 magnets(25-4, 29-1, 29'-1), and 3N4/2 magnets (25-4, 29-4, 29'-4) for polarising the fourth magnetoresistor (4) 3N4/2 magnets being divided into three parallel columns each comprising N4/2 magnets.

9. A sensor according to claim 7 wherein the groups (13'-2; 13'-3) of fingers (12') forming together the second and third magnetoresistors (2, 3) respectively are located in the magnetic leakage field zones of two consecutive magnets of columns of lateral magnets (28, 29, 29').

10. A sensor according to claim 9 wherein each of the groups (13'-2; 13'-3) of fingers (12') forming together the second and third magnetoresistors (2, 3) respectively is located separately in the magnetic leakage field zones of two consecutive magnets of columns of lateral magnets (28, 29, 29').

11. A sensor according to claim 2, wherein the magnets (28, 29, 29') are divided into the form of a matrix into rows and columns, in that the fingers (12, 12') forming together each magnetoresistor (1–4) are divided into groups (13-1; 13-4; 13'-2; 13'-3) of fingers and groups (13-1; 13-4) of fingers belonging to magnetoresistors (1, 4) arranged in a main magnetisation field zone are housed between magnets of consecutive columns belonging to the same row and in that groups of fingers (13'-2; 13'-3) belonging to magnetoresistors (2, 3) arranged in a magnetic leakage field zone are housed between consecutive magnets belonging to the same column.

12. A sensor according to claim 11, wherein it comprises at least 3 columns of magnets, divided into one central column and two lateral columns and in that groups of fingers housed in a magnetic leakage field zone are only present between consecutive magnets belonging to the lateral columns.

13. A sensor according to claim 12 wherein the magnet of the first row of each central column of magnets is absent and in that a group of fingers housed in a magnetic leakage field zone between consecutive magnets belonging to the lateral columns is present in each interval between consecutive magnets of said lateral columns and a group of fingers belonging to magnetoresistors arranged in a main magnetisation field zone is present between each interval between consecutive magnets of the same row, with the exception of the first row.

14. A sensor according to claim 6, wherein N1 is equal to N4 and in that N2 is equal to N3.

15. A sensor according to claim 6, wherein N1, N2, N3 and N4 are equal to each other.

16. A sensor according to claim 1 wherein the magnets (15–19; 26–29; 38, 39) have along a cross-section parallel with the layers, each magnet having main flux faces (6, 7) and leakage faces, the main magnetisation field going out and coming in said main flux faces and the magnetic leakage field zones being located on either side of said leakage faces (8, 9), the main flux faces (6, 7) being perpendicular to the leakage faces, the main magnetisation field zones of each magnet being roughly centred on a central axis of the main flux faces (6,7) of each magnet, the magnetic leakage field zones of each magnet being roughly centred on a central axis of the leakage faces (8, 9).

17. Sensor comprising a magnet (15) and a bridge of magnetoresistors (1–4), said magnet and said magnetoresistors being deposited in the form of layers on a same substrate (20), the magnetoresistors each having a longitudinal direction, the bridge comprising two magnetoresistors (1, 3) or a first (1, 4) and a second (2, 3) pair of magnetoresistors, each magnetoresistor being polarised by said magnet, said magnet generating a magnetic field having two main magnetisation field zones, one incoming field zone and one outgoing field zone, aligned along a main magnetisation direction, and two magnetic leakage field zones, the first (1) of said two magnetoresistors of the bridge or each of the magnetoresistor (1, 4) of the first pair of magnetoresistors of the bridge being arranged in a main magnetisation zone field zone and the other magnetoresistor (3) or each of the magnetoresistors (2, 3) of the second pair of magnetoresistors of the bridge being arranged in a magnetic leakage field zone, so that said two magnetoresistors (1, 3) or the magnetoresistors of each pair are polarised by magnetic fields of opposite directions, said magnet being substantially at the same height over the substrate as the magneto resistors (1–4) and the magnetoresistors of the bridge having their longitudinal direction parallel with said main magnetisation direction of the magnet.

* * * * *